(12) United States Patent
Buehler et al.

(10) Patent No.: US 8,015,527 B2
(45) Date of Patent: Sep. 6, 2011

(54) ROUTING OF WIRES OF AN ELECTRONIC CIRCUIT

(75) Inventors: Markus Buehler, Weil im Schoenbuch (DE); Juergen Koehl, Weil im Schoenbuch (DE); Markus Olbrich, Langenhagen (DE); Philipp Panitz, Lehrte (DE)

(73) Assignee: International Business Machines Corporation, Armonk, NY (US)

( * ) Notice: Subject to any disclaimer, the term of this patent is extended or adjusted under 35 U.S.C. 154(b) by 538 days.

(21) Appl. No.: 12/166,012

(22) Filed: Jul. 1, 2008

(65) Prior Publication Data

US 2009/0013293 A1 Jan. 8, 2009

(30) Foreign Application Priority Data

Jul. 6, 2007 (EP) .................................... 07111948

(51) Int. Cl.
*G06F 17/50* (2006.01)
(52) U.S. Cl. ........................................ 716/108; 716/113
(58) Field of Classification Search .................. None
See application file for complete search history.

(56) References Cited

U.S. PATENT DOCUMENTS

| | | | | |
|---|---|---|---|---|
| 4,924,430 | A * | 5/1990 | Zasio et al. | 716/108 |
| 5,095,454 | A * | 3/1992 | Huang | 703/19 |
| 6,202,192 | B1 * | 3/2001 | Donath et al. | 716/108 |
| 6,539,536 | B1 * | 3/2003 | Singh et al. | 716/102 |
| 6,557,151 | B1 * | 4/2003 | Donath et al. | 716/108 |
| 7,073,141 | B2 * | 7/2006 | Novakovsky et al. | 716/103 |
| 7,698,674 | B2 * | 4/2010 | Kalafala et al. | 716/113 |

OTHER PUBLICATIONS

Alpert et al., "Closed-Form Delay and Slew Metrics Made Easy," IEEE Trans. on CAD of ICs and Systems, vol. 23, No. 12, Dec. 2004, pp. 1661-1669.*
Chan et al., "Computing Signal Delay in General RC Networks by Tree/Link Partitioning," IEEE Trans. on CAD, vol. 9, No. 8, Aug. 1990, pp. 898-902.*
Li et al., "Wire Sizing for Non-Tree Topology," IEEE Trans. on CAD of ICs and Systems, vol. 26, No. 5, May 2007, pp. 872-880.*
McCoy et al., "Non-Tree Routing," IEEE Trans. on CAD of ICs and Systems, vol. 14, No. 6, Jun. 1995, pp. 780-784.*
Panitz et al., "Robust Wiring Networks for DfY Considering Timing Constraints," ACM GLSVLSI'07, Mar. 11-13, 2007, pp. 43-48.*
"Non-tree Routing for Reliability and Yield Improvement", Kahng et al., IEEE Transactions on CAD of Integrated Circuits and Systems, 23(A), Jan. 2004, 7 pages.
"Application of Global Loops on ULSI Routing for DfY", Panitz, Olbrich, Koehl and Barke, IEEE, 2006, 4 pages.
"Asymptotic Waveform Evaluation for Timing Analysis", Pillage and Rohrer, IEEE Transactions on Computer Aided Design, vol. 9, No. 4, Apr. 1990, pp. 352-366.
"Yield Improvement by Local Wiring Redundancy", Bickford et al., Quality Electronic Design, 2006, ISQED '06, 7th International Symposium 6 pages.

* cited by examiner

*Primary Examiner* — Leigh Marie Garbowski
(74) *Attorney, Agent, or Firm* — Steven Chiu

(57) ABSTRACT

The invention relates to a delay calculation method for wiring nets of an electronic circuit, wherein a net within an electronic circuit comprises a driver pin and a receiving pin being coupled by at least one loop, the loop comprising a first branching path and a second branching path electrically parallel to the first branching path, wherein at least a first and a second branching point connect the branching paths. The method comprises the steps of disconnecting each branching path once at a time at a specific point in said the at least one loop which connects a driver to at least one specific receiving pin; calculating a delay value of a signal connection between the driver pin and each of the receiving pin for each of the disconnected branching paths of each loop; storing maximum and/or minimum calculated delay values; and applying at least one of the delay values for static timing analysis of the electronic circuit.

16 Claims, 9 Drawing Sheets

Figure 1B:
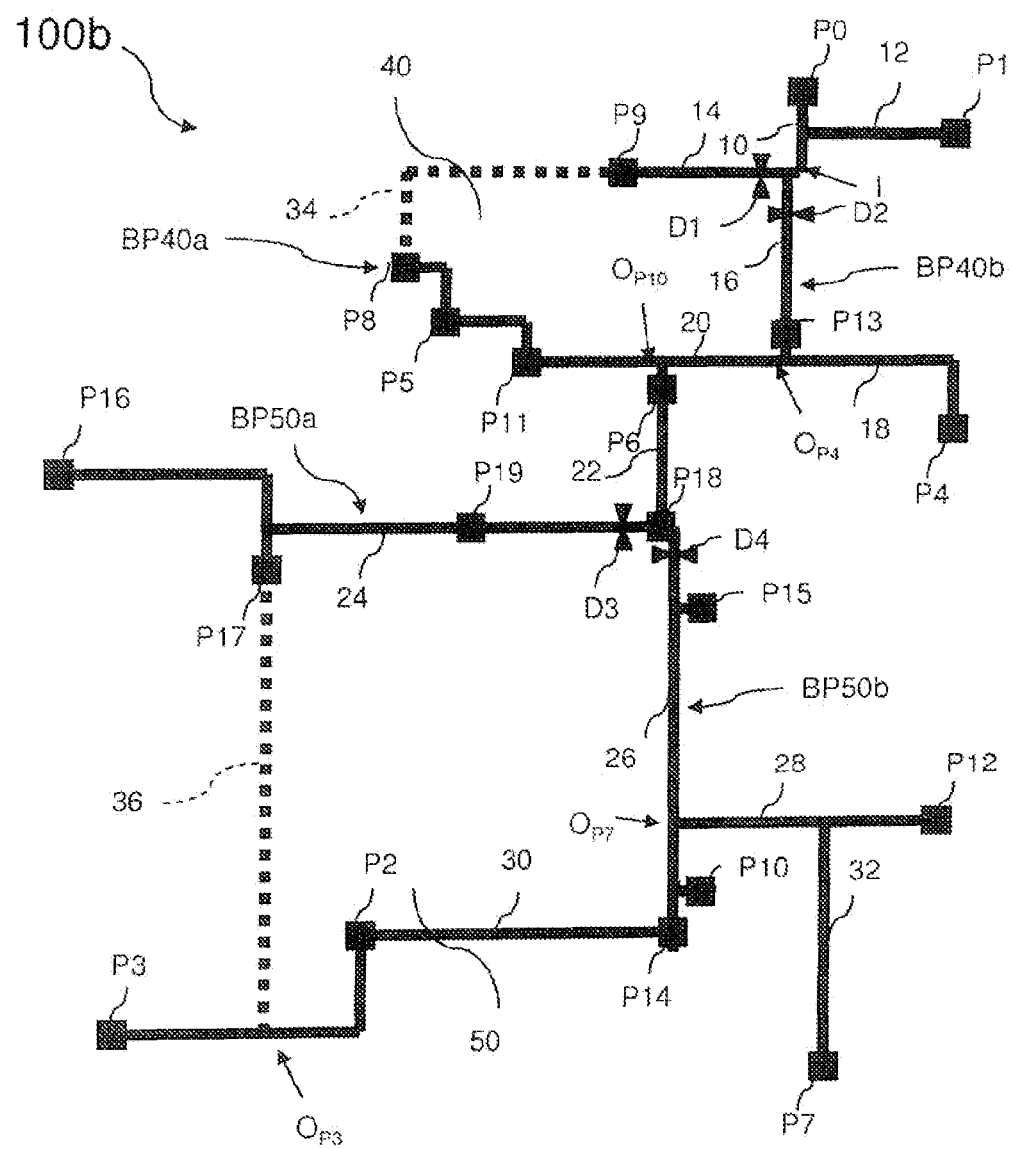

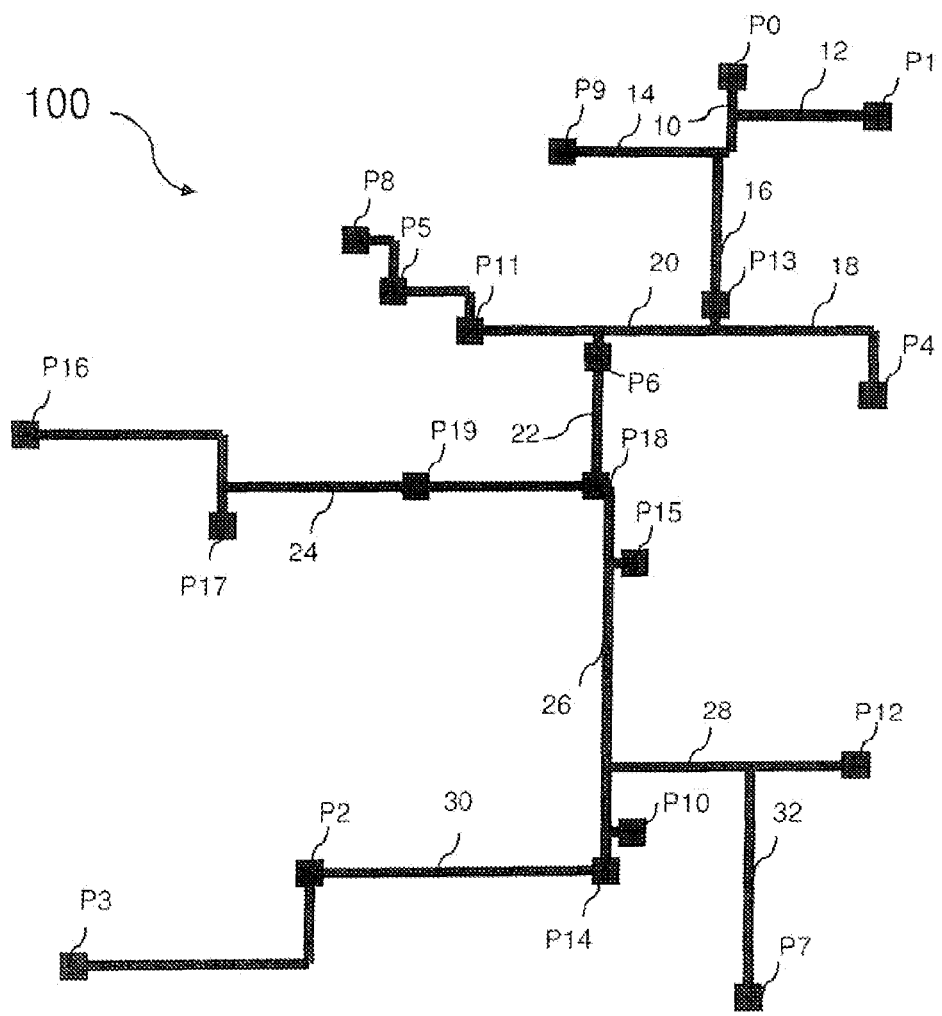
Fig. 1a --Prior Art--

| Pin | No Open | D1 | D2 | D3 | D4 | Max |
|---|---|---|---|---|---|---|
| P0 | 16.28 | 16.28 | 16.28 | 16.28 | 16.28 | 16.28 |
| P1 | 16.43 | 16.43 | 16.43 | 16.43 | 16.43 | 16.43 |
| P2 | 19.42 | 21.43 | 20.90 | 20.19 | 21.94 | 21.94 |
| P3 | 19.41 | 21.02 | 21.22 | 20.18 | 21.93 | 21.93 |
| P4 | 17.56 | 17.56 | 17.56 | 18.05 | 20.54 | 20.54 |
| P5 | 17.68 | 17.68 | 17.68 | 18.87 | 19.49 | 19.49 |
| P6 | 18.06 | 18.06 | 18.06 | 18.83 | 20.57 | 20.57 |
| P7 | 19.29 | 22.17 | 20.03 | 20.06 | 21.80 | 22.17 |
| P8 | 17.61 | 17.61 | 17.61 | 18.90 | 19.28 | 19.28 |
| P9 | 17.11 | 17.11 | 17.11 | 19.00 | 17.77 | 19.00 |
| P10 | 19.32 | 22.04 | 20.20 | 20.10 | 21.84 | 22.04 |
| P11 | 17.77 | 17.77 | 17.77 | 18.80 | 19.86 | 19.86 |
| P12 | 19.22 | 22.21 | 19.87 | 19.99 | 21.73 | 22.21 |
| P13 | 17.41 | 17.41 | 17.41 | 17.83 | 20.50 | 20.50 |
| P14 | 19.35 | 21.98 | 20.30 | 20.12 | 21.86 | 21.98 |
| P15 | 18.80 | 22.35 | 18.97 | 19.57 | 21.31 | 22.35 |
| P16 | 19.22 | 19.97 | 21.75 | 19.99 | 21.73 | 21.75 |
| P17 | 19.19 | 20.02 | 21.65 | 19.96 | 21.70 | 21.70 |
| P18 | 18.63 | 22.37 | 18.64 | 19.40 | 21.14 | 22.37 |
| P19 | 18.88 | 19.21 | 21.76 | 19.45 | 21.39 | 21.76 |

Fig. 4

| Pin | No open | D11 | D12 | D13 | D14 | D15 | D16 | Max |
|---|---|---|---|---|---|---|---|---|
| P30 | 14.91 | 14.91 | 14.91 | 14.91 | 14.91 | 14.91 | 14.91 | 14.91 |
| P32 | 16.92 | 19.17 | 22.92 | 17.30 | 17.17 | 16.57 | 16.64 | 22.92 |
| P34 | 16.95 | 23.02 | 19.17 | 16.57 | 16.70 | 17.30 | 17.23 | 23.02 |
| P36 | 17.63 | 21.56 | 21.97 | 17.74 | 18.18 | 17.54 | 18.38 | 21.97 |
| P38 | 17.64 | 22.03 | 21.52 | 17.54 | 18.30 | 17.74 | 18.26 | 22.03 |
| P40 | 17.64 | 22.89 | 20.67 | 23.18 | 17.32 | 18.25 | 17.99 | 23.18 |
| P42 | 18.61 | 22.43 | 23.06 | 20.95 | 18.71 | 22.21 | 18.50 | 23.06 |

Fig. 5b

ROUTING OF WIRES OF AN ELECTRONIC CIRCUIT

FIELD OF THE INVENTION

The invention relates to a delay calculation method, particularly for wiring nets of an electronic circuit, a data processing program and a computer program product according to the preambles of the independent claims.

DESCRIPTION OF THE RELATED ART

With decreasing feature size opens in the chip's wiring become more and more important as functional yield detractors. Yield losses are directly related to the revenue of semiconductor companies. With decreasing feature sizes defects like opens are more common than shortcuts.

There are several solutions to the problem of disruptions such as opens in the chip's wiring known in the art. One is the augmentation of so called Steiner trees as published in the paper of Andrew B. Kahng, Bao Liu, Ion I. Mandoiu "Non-tree Routing for Reliability and Yield Improvement", IEEE Transactions on CAD of Integrated Circuits and Systems, vol. 23(1), January 2004, pp. 148-156.

Another approach suggests the application of Hamilton cycles as published by P. Panitz, M. Ohlbrich, J. Koehl, E. Barke "Application of Global Loops on ULSI Routing for DfY", Proceedings of the International Conference on IC Design and Technology, May 2006, pp. 179-182.

The technique of improving yield of electronic circuit manufacturing processes by adding via redundancy through the use of local loops is described in J. Bickford, M. Bühler, J. Hibbeler, J. Koehl, D. Müller, S. Peyer "Yield Improvement by Local Wiring Redundancy", Proceedings of the 7$^{th}$ International on Quality Electronic Design, 2006.

All cited solutions have in common that general routing graphs are applied to connect a set of pins. These graphs contain one or more loops to protect the net against disconnections. If a loop is affected by an open defect it will still work functionally correct. The defect will not be detected by functional testing. To guarantee the parametrical correctness of the circuit static timing analysis has to be performed. Static timing analysis relies on the worst case delay of the wiring net. The worst delay is defined as the highest delay that occurs under worst case manufacturing and environmental conditions and a single or multiple opens.

The various solutions known in the art lead to an infinite number of delay calculations. In practice this can be approximated by a finite but high number of delay calculations. For every receiving circuit in the net the worst delay value has to be stored and is used for static timing analysis. In today's chips timing verification this is computationally expensive. Therefore static timing analysis relies on fast delay calculation methods.

SUMMARY OF THE INVENTION

It is an objective of the invention to provide a time efficient delay calculation routing method for wiring of nets of an electronic circuit which allows avoiding time consuming dynamic analyses. Another objective is to provide a data processing program and a computer program product for performing such a method.

The objectives are achieved by the features of the independent claims. The other claims and the description disclose advantageous embodiments of the invention.

A delay calculation method for wiring nets of an electronic circuit is proposed, wherein a net within an electronic circuit comprises a driver pin and a receiving pin which are being coupled by at least one loop. The loop comprises a first branching path and a second branching path that is electrically parallel to said first branching path, wherein at least a first and a second branching point connect said branching paths. The preferred delay calculation method comprises the steps of disconnecting each branching path once at a time at a specific point in said at least one loop which connects a driver to at least one specific receiving pin;

calculating a delay value of a signal connection between said driver pin and each of said receiving pin for each of said disconnected branching paths of each loop;

storing maximum values of said calculated delay values; and applying at least one of said delay values for static timing analysis of the electronic circuit.

The proposed method offers time efficient routing of wires of an electronic circuit which is resistant to opens, wherein local wiring redundancy by wiring loops is assumed and static timing analysis is performed which relies on the worst case delay values calculated by the described method.

The method may be applied for various kinds of delay calculation such as AWE or higher order delay metrics. Preferably, the known Elmore delay, which is a widespread delay metric, can be used for delay calculation. It reaches its maximum if each loop is disconnected at two specific points. Therefore, the excessive amount of additional timing runs is favorably reduced to only two runs per loop in the routing graph, if only one loop per run is considered.

In the case of more than one open per net the delay calculation method is augmented by considering more than one loop at a time per delay calculation run. In this case each branching path has to be disconnected once at a time for any combination of branching paths at a specific point in said more than one loop, particularly considering all loops downstream a first loop. Although the number of runs increases for the latter case, the necessary number of runs is still significantly smaller than in the known art. For example, considering only one loop at a time yields a number of runs of twice the number of loops, and considering all downstream loops with one open per time and all possible combinations of opens in the downstream loops yields a number of runs of $2^{(number\ of\ loops)}$.

Further, a data processing program for execution in a data processing system is proposed, which is comprising software code portions for performing the said delay calculation method when said program is run on a computer.

According to another aspect of the invention a computer program product is proposed, which is stored on a computer usable medium, which is comprising computer readable program means for causing a computer to perform said delay calculation method when said program is run on said computer. Particularly the steps are comprising disconnecting each branching path once at a time in said at least one loop which connects a driver pin with at least one specific receiving pin;

calculating a delay value of a signal connection between said driver pin and each of said receiving pins for each of said disconnected branching paths of each loop;

storing maximum and/or minimum values of said calculated delay values; and applying at least one of said delay values for static timing analysis of the electronic circuit.

The invention can be favorably applied for parametric testing of an electronic circuit design during a design phase.

BRIEF DESCRIPTION OF THE INVENTION

Figure 2A:
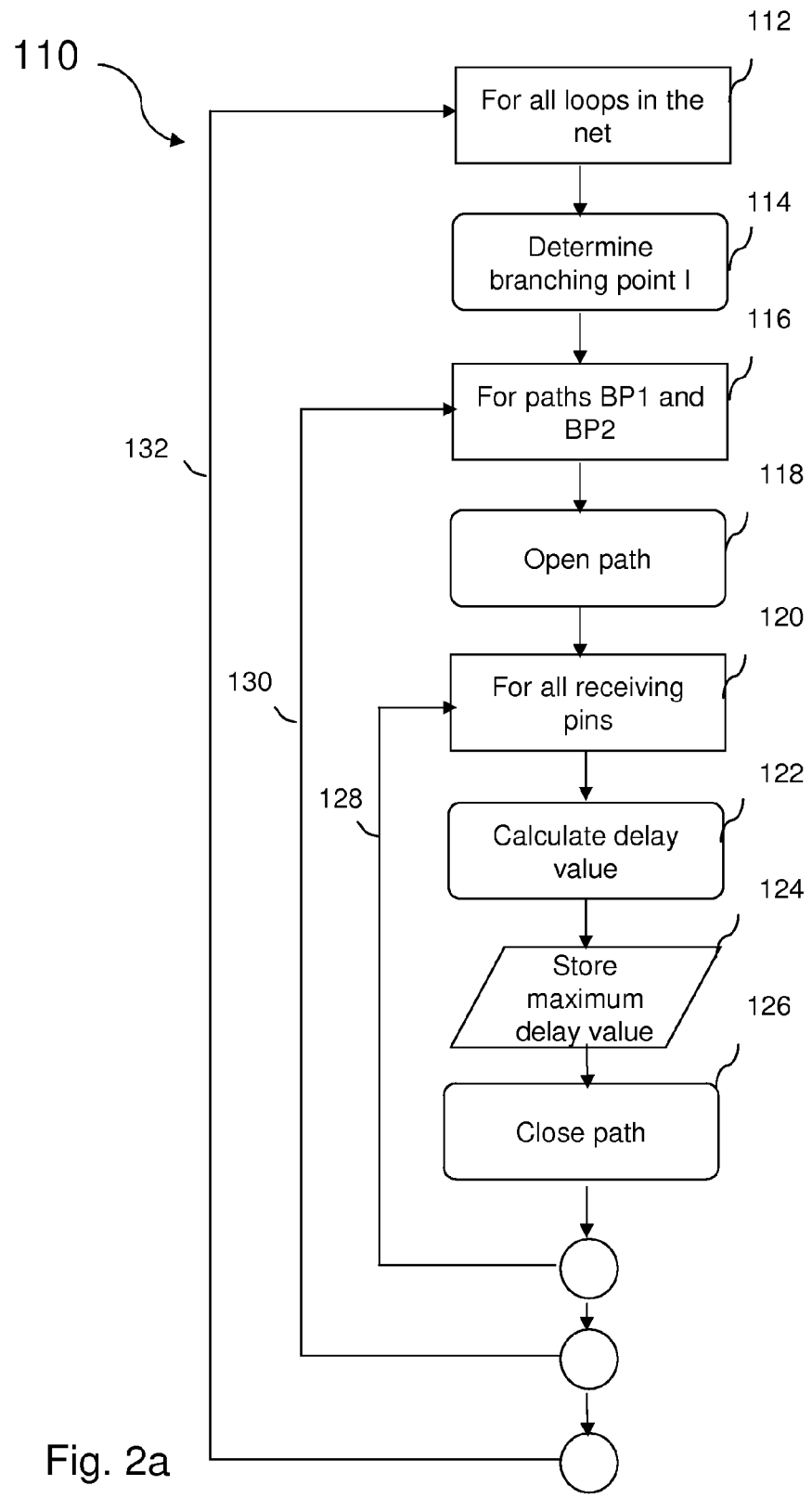
Figure 2B:
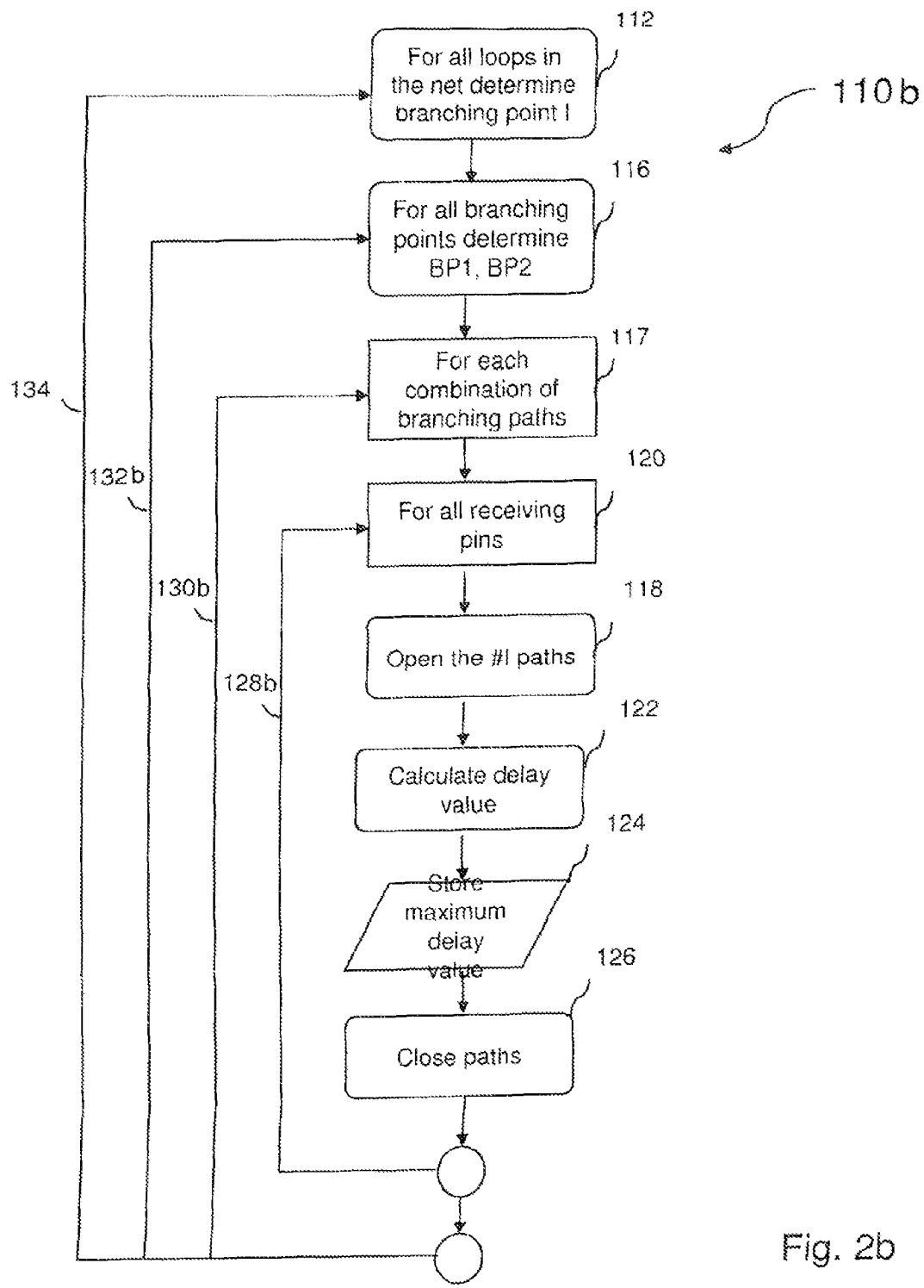
Figure 3:
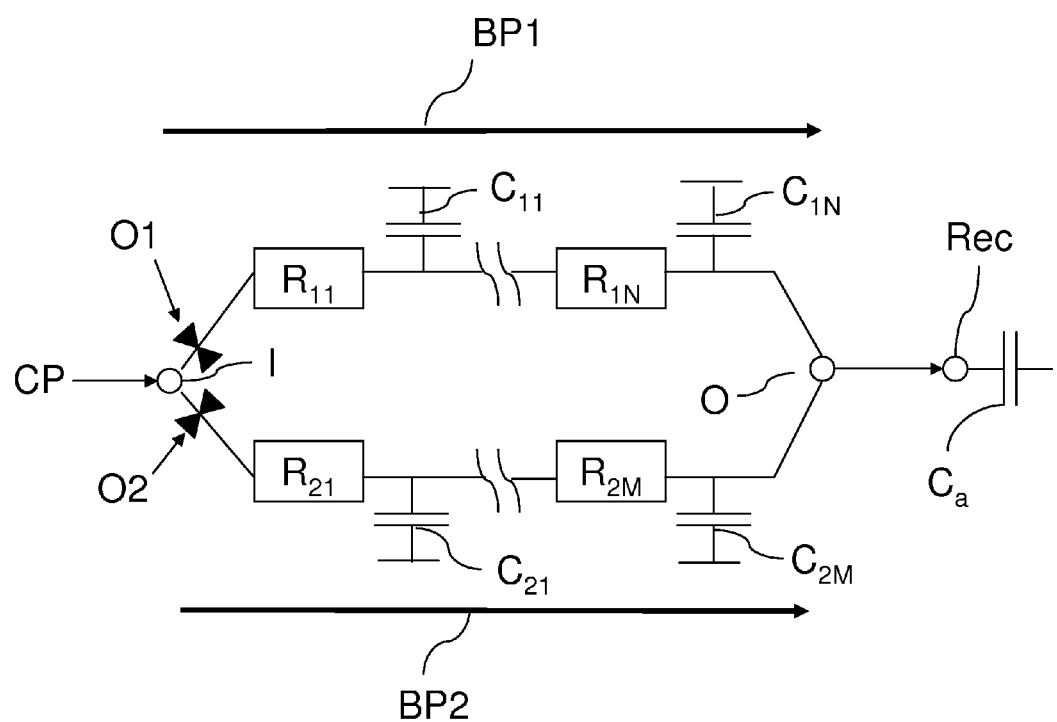
Figure 5A:
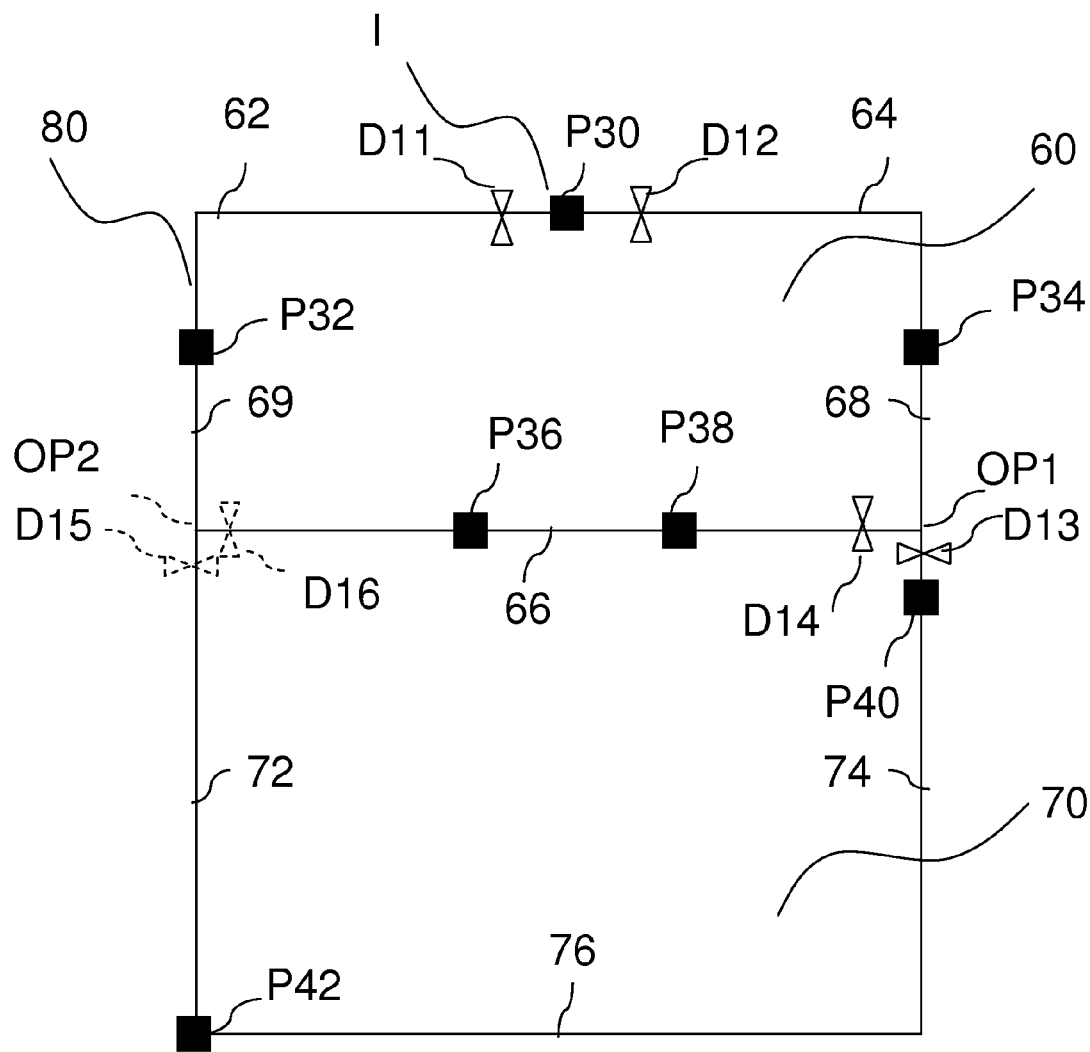
Figure 6:
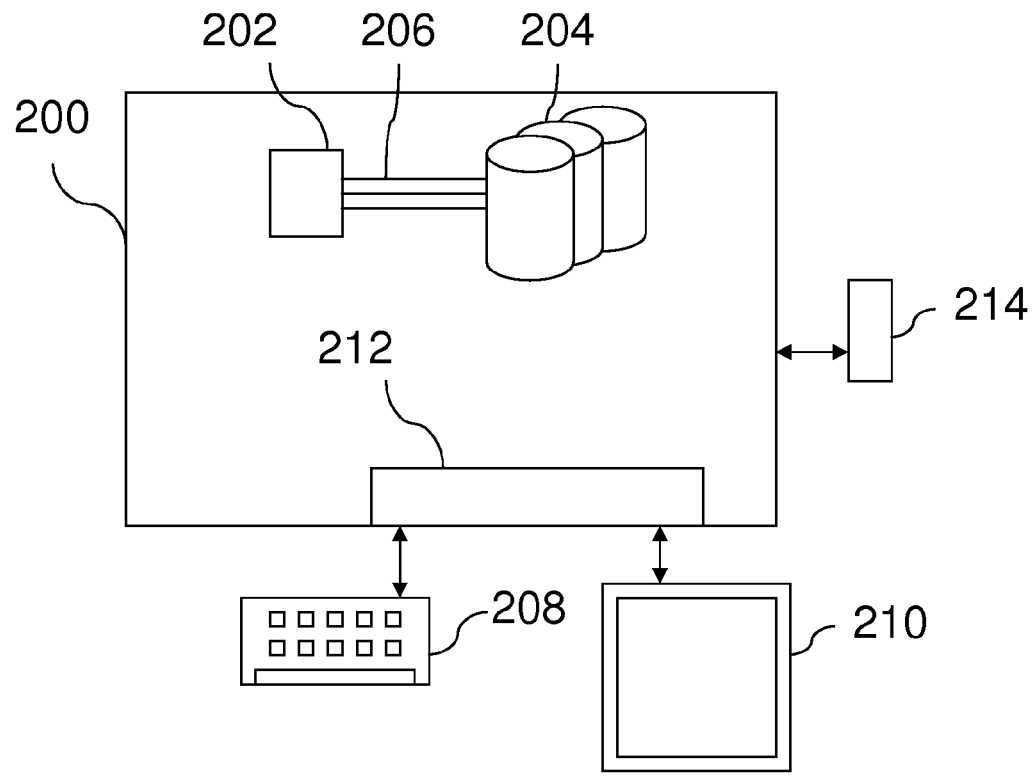

The present invention together with the above-mentioned and other objects and advantages may best be understood from the following detailed description of the embodiments, but not restricted to the embodiments, wherein is shown in:

FIG. 1a a routing tree for an electronic circuit;

FIG. 1b the routing tree of FIG. 1a augmented by loops with positions of disconnections of the loops for delay calculations according to a first preferred embodiment;

FIG. 2a a flowchart for calculation of delay values according to the first embodiment of FIG. 1b;

FIG. 2b a flowchart for calculation of delay values according to another embodiment for several opens;

FIG. 3 an RC model of a loop according to the preferred embodiment of FIG. 1b;

FIG. 4 a table with calculated Elmore delay values according to the preferred embodiment of FIG. 1b;

FIG. 5a a routing graph with nested loops according to a second preferred embodiment;

FIG. 5b a table with calculated Elmore delay values according to the second preferred embodiment of FIG. 5a FIG. 6 a preferred data processing system for performing a preferred method according to the invention.

DETAILED DESCRIPTION OF THE PREFERRED EMBODIMENTS

According to the invention, a delay calculation method for nets within an electronic circuit is proposed, wherein the electronic circuit is comprising a driver pin and a receiving pin which are being coupled by at least one loop, wherein further the loop is comprising a first branching path and a second branching path that are electrically parallel to said first branching path, wherein at least a first and a second branching point connect said branching paths, wherein the delay calculation method is characterized by the steps of disconnecting each branching path once at a time in each loop which connects a driver to at least one specific receiving pin; calculating a delay value of a signal connection between said driver pin and said receiving pin for each of said disconnected branching paths of each loop for each connection between said driver pin and each receiving pin; storing maximum values of said calculated delay values; and applying at least one of said delay values for static timing analysis of the electronic circuit.

For detailed description of the preferred embodiment FIG. 1a depicts a routing tree 100 (known in the art as Steiner tree) of an electronic circuit. A pin P0 is an emitting cell for an electronic signal and will be called later on driver P0 or driver pin P0. P1-P19 are receiving cells or pins of the circuit considered. An open anywhere in the tree disconnects the way from the driver P0 to at least one of the receiving pins P1-P19 which leads to a functional fail of the electronic circuit. The individual receiving pins P1-P19 are connected to the driver P0 by a number of signal paths 10-32. For instance, driver pin P0 is connected with receiving pin P7 via signal paths 10, 16, a part of signal paths 20, 22, 26, a part of signal paths 28, 32.

For description of the preferred embodiment of the invention FIG. 1b shows the routing tree 100b after the insertion of loops 40 and 50 to add redundancy for survival of the electronic functions if an open occurs in the tree 100b. The loops 40, 50 are formed by augmenting the net by additional connections, i.e. by introducing additional signal path 34 closes the first loop 40 by connecting pins P9 and P8, and by introducing signal path 36 closes the second loop 50 by connecting pin P17 and the signal path between pin P3 and P2 (additional dashed lines in FIG. 1b). Preferably, the wire widths are equal.

Because of the additional connections by paths 34, 36 an open will not automatically generate a functional fail because the net stays connected, but it will change the net's topology and increase or decrease the signal delay of the connection.

The routing tree 100b depicted in FIG. 1b only contains loops 40, 50 which do not share wiring edges. A vast majority of wiring loops are of this type.

Loop 40 of FIG. 1b contains three branching points I, OP4, OP10; one branching point I adjacent to the driver P0 and two lying downstream to possible receiving pins P4 and P10. The branching point I is connected to the branching points OP4, OP10 by the possible branching paths BP40a and BP40b. The actual branching paths BP40a and BP40b, particularly the path lengths are depending on which actual branching point OP4 or OP10 is chosen. In an analogous deliberation, loop 50 consists of the first branching point P18 and the second branching point OP3 if considering receiving pin P3, or the second branching point OP7 if considering receiving pin P7, respectively. The branching points P18, OP3, OP7 are connected by possible branching paths BP50a and BP50b. As already mentioned, the actual branching paths BP40a, BP40b, BP50a, BP50b depend on the actual point chosen where the branching paths BP40a, BP40b, BP50a, BP50b reunite in the loops 40, 50, which in turn depends on the specific receiving pin considered.

Whereas the first branching point (I in loop 40) is unique in every loop 40, 50, the second branching point depends on the specific receiving pin that is considered. However, the second branching point, for instance OP10, is the same for all receiving pins P2, P3, P4, P6, P7, P10, P12, P14, P15, P16-P19 further downstream with respect to the driver P0. For loop 50, for instance, the unique first branching point is pin P18, where the two branching paths BP50a, BP50b split.

Timing violations are possible in the case of an open and must be considered during static timing analysis.

For calculation of the delay, any common delay calculation technique, such as asymptotic waveform evaluation (AWE) as published in Pillage, L. T.; Rohrer, R. A. "Asymptotic waveform evaluation for timing analysis", IEEE Transactions on Computer-Aided-Design of Integrated Circuits and Systems, April 1990, pp. 352-366, can be used. The approach is not restricted to a specific delay calculation technique.

The preferred approach of the preferred embodiment is to disconnect the loops 40, 50 directly behind the first branching point I in loop 40 and P18 in loop 50 and calculate the delay value. The first branching point I in the loop 40 is the start node of the two disjoint paths, branching paths BP40a and BP40b, leading to a specific second branching point OP10, for instance. For branching point OP10 the branching path BP40a comprises connections 14 and 34 and branching path BP40b comprises connections 16 and 20. For branching point OP4 the first branching path BP40a would comprise the signal paths 14, 34 and 20 and the second branching path BP40b would comprise signal path 16. For clarity, only one example is shown.

Each of those two paths BP40a and BP40b has to be disconnected directly behind the first branching point I, indicated by a first open D1 in branching path BP40a and a second open D2 in branching path BP40b.

For the loop 50, the unique first branching point is pin P18 and the two branching paths are BP50a and BP50b. For the second branching point OP3 the branching path BP50a comprises the signal paths 24 and 36 and branching path BP50b comprises the signal paths 26 and 30. For a second branching point OP7 branching path BP50a would comprise signal paths 24, 36 and 30, whereas branching path BP50b would comprise signal path 26.

In an analogous manner each of the two branching paths BP50a and BP50b has to be disconnected directly behind the first branching point P18, indicated by a first open D3 in branching path BP50a and a second open D4 in branching path BP50b.

As there is exactly one open per branching path, i.e. D1 for branching path BP40a, D2 for branching path BP40b, D3 for branching path BP50a, D4 for branching path BP50b, this favorably results in only two delay calculations per loop 40, 50.

Advantageously, the worst delay is defined as the highest delay that occurs under worst case manufacturing and environmental conditions and one single open.

The worst delay at every receiving pin P1-P19 is annotated, stored and used for the static timing analysis. With this technique it is ensured that an electronic circuit works correctly if an open occurs on the protected wires of the circuit. Compared to the state of the art the described approach of the preferred embodiment significantly reduces the number of delay calculations.

For detailed timing analysis of the layout of an electronic chip also best case timing analyses can be used. In this case, instead of the maximum delay values, the minimum delay values are calculated in an analogous manner to the maximum delay value calculation.

FIG. 2a depicts a flowchart 110 describing the general approach of the delay calculation method for a general net topology according to the preferred embodiment. For all nets with a routing graph containing loops delay calculations are performed. The different steps of the method can be described as follows:

For all loops (step 112) in the net the first branching point I is determined (step 114). This can be implemented applying a so called depth-first-search (DFS) on the routing graph. For every branching point determined in step 114, the paths BP1 and BP2 are determined (step 116) and each of them is opened directly behind the first branching point I each at a time (step 118). For the specific open paths BP1 or BP2 and for all possible receiving pins (step 120) delay calculations are performed (step 122) and the respective maximum (worst) delay value calculated is stored (step 124). In subsequent step 126 then the loop is closed. The innermost flow-chart loop 128 is repeated before the middle flow-chart loop 130 which is looped over before the outer flow-chart loop 132.

FIG. 2b depicts a flowchart 110b describing the general approach of the delay calculation method for a general net topology according to second preferred embodiment. For all nets with a routing graph containing loops delay calculations are performed. The different steps of the method can be described as follows: For all loops in the net the first branching point I is determined (step 112). This can be implemented applying a so called depth-first-search (DFS) on the routing graph. For every branching point I determined in step 112, the paths BP1 and BP2 are determined (step 116). For each combination of branching paths (step 117) and for all possible receiving pins (step 120) each of them is opened directly behind the first branching point I each at a time (step 118). For the specific open paths BP1 or BP2 delay calculations are performed (step 122) and the respective maximum (worst) delay value calculated is stored (step 124). In subsequent step 126 then the loop is closed. The innermost flow-chart loop 128b is repeated before the middle flow-chart loop 130b which is looped over before the outer flow-chart loop 132b which is looped over before the outermost flow-chart loop 134.

As an example the Elmore delay, which is a common delay metric in the design of integrated circuits and is described, for instance, in Elmore, W. C. "The transient response of damped linear networks with particular regard to wideband amplifiers", Journal of Applied Physics, 1948, pp. 55-63, is the worst case delay obtained if the routing graph is opened at the possible opens D1-D4, shown in FIG. 1b. Other delay metrics can also be applied of course.

For delay calculation a routing tree can be modeled as an RC network consisting of grounded capacitors $C_{11}$-$C_{1N}$, $C_{21}$-$C_{2M}$ and resistors, $R_{11}$-$R_{1N}$, $R_{21}$-$R_{2M}$ which connect nodes I and O, which is demonstrated for a generic example in FIG. 3, depicting a detail of a lager circuit. There are tools known in the art to gain the values of the resistors and capacitors from the circuit layout which is called parasitic extraction. Applying the Elmore delay on RC networks the delay time for the path from the driver to the receiving pin, $T_{Delay}^{Rec}$, can be calculated as follows:

$$T_{Delay}^{Rec} = \sum_{k=1}^{N} R_k^{Rec} C_k$$

With
$T_{Delay}^{Rec}$=delay time from a driver to the receiving pin Rec
$C_k$=capacitance k in the routing graph
$R_k^{Rec}$=resistance of the common path from the driver to the receiver and capacitance $C_k$
k=index for summing the capacitance values
N=total number of capacitors in routing graph Every of the N capacitors in the net contribute to the delay. The capacitance value is weighted with the resistance of the common path CP from the driver to the receiving pin Rec and the considered capacitance with index k.

If an open O1 or O2 occurs, the considered capacitors still contribute to the delay value, but the topology of the network changes which changes the path from the driver to the receiving pins. If the open does not change the path from the driver to the receiving pin considered the delay value will not change because $R_k^{Rec}$ will not change for any capacitance. With reference to FIG. 1b an open D3 or D4 in the loop 50 will not affect the delay from the driver P0 to the receiving pin P6 because the loop 50 is situated further downstream of P6. Considering the receiving pin P7 an open D3 or D4 in loop 50 will change the path from the driver P0 to P7, hence different weights have to be used in the calculation of the delay.

The generic situation of a loop in the routing tree after the parasitic extraction for delay calculation is shown in FIG. 3. CP denotes the common path from the driver to the point I in the loop. The delay from the driver before the loop to the receiving pin Rec is considered which is situated behind the loop. The signal path CP coming from the driver branches at first branching point I. The two branches BP1 and BP2 and reunite at second branching point O. If the receiving pin Rec lies on the loop it is connected to the branching point O. The branching paths BP1, BP2 are modeled for delay calculation by the RC network containing the resistors $R_{11}$-$R_{1N}$, $R_{21}$-$R_{2M}$ and the capacitors $C_{11}$-$C_{1N}$, $C_{21}$-$C_{2M}$. If the receiving pin Rec lies in a tree connected to the loop, second branching point O is the node where the tree is connected to the loop. All trees that are connected to the loop and do not lie on the path BP1 or BP2 from the driver CP to the receiving pin Rec can be replaced by a capacitor C with a capacitance value that is equal to the sum of all capacitances in the tree. This replacement will not change the value of calculated delay.

If an open O1, O2 occurs on the loop it can disconnect either BP1 or BP2. If BP1 is disconnected by the open O1, the path from the driver CP to the receiving pin Rec does not branch any more. It comes from the driver, takes the path BP2 between branching points O and I and leads further downstream to the receiving Rec. The capacitances on the open path BP1 can be replaced by a capacitance connected to branching point I and a capacitance connected to branching point O dependent on the place where the open O1 disconnects BP1. The capacitance at branching point I is weighted with the resistance of the path from the driver to the branching point I and the capacitance at branching point O is weighted with the resistance of the path from the driver to the branching point O. Obviously, the path from the driver to branching point O has a larger resistance value because it passes branching point I and takes branching path BP2 to branching point O. The largest delay value is obtained if the capacitance connected to branching point O is maximal. This happens if the network is disconnected at the open O1. Disconnecting of branching path BP2 equally yields that the maximum delay is gained if BP2 is disconnected at open O2.

Therefore it is sufficient to disconnect every loop in the routing tree at the two opens O1, O2 given above to obtain the worst delay, i.e. one open O1, O2 per branching path BP1, BP2 for a specific receiving pin. The technique has to be applied to every loop in the routing tree because there is at least one receiving pin Rec which has a path from the driver CP that leads through all loops.

Nevertheless, the preferred approach described above is very efficient because it is a design objective to keep the wire length and therefore the number of loops as small as possible.

FIG. 4 shows a table displaying in an exemplary way Elmore delay values calculated for no open and for each of the single opens D1-D4 in the two loops 40, 50 (FIG. 1b) and for each of the possible receiving pins P1-P19 using realistic values for an exemplary electronic circuit.

For the exemplary electronic circuit represented by the Steiner tree 100 in FIG. 1a twenty pins P0-P19 were randomly placed on a 100×100µ$^2$ layout. The Steiner tree 100 shown in FIG. 1a was calculated and an augmentation approach used to insert loops into the tree 100. The augmented tree 100 is shown in FIG. 1b. A parasitic extraction was performed with the following values: $R_{driver}$ between 50 and 100Ω, preferably around 80Ω, $R_{pull}$ between 0.1 and 0.5Ω, preferably around 0.32Ω, $C_{pull}$ between 0.1 and 0.3 fF, preferably around 0.235 fF, $C_{rec}$ between 4 and 8 fF, preferably around 6 fF. Wire segments were modelled using a so called Pi-model.

The method of asymptotic waveform evaluation AWE was used to calculate the signal propagation delays. A first order approximation which yields the Elmore delay was applied. First the delay was calculated without an open in the net which is shown in the second column of the table. Then the net was disconnected at the four opens D1-D4, shown in FIG. 1b and the delay calculated. The obtained values are shown in the four succeeding columns. The maximum delay values are separately shown in the last column.

The method according to the preferred embodiment was validated by assuming an open in every wiring segment and calculating the delay values. It was observed that the overall maximum was identical with the maximum delay value obtained in the table of FIG. 4 thus confirming the validity of the method.

Although the branching paths BP40a, BP40b, BP50a, BP50b can be disconnected at every point, said branching paths are disconnected advantageously close to a joint specific branching point I, OP10, P18, OP3. Reasonably, the branching paths BP40a, BP40b, BP50a, BP50b are also disconnected adjacent to said branching point I, P18 proximate to the driver pin P0.

Preferably each of said disconnected branching paths BP40a, BP40b; BP50a, BP50b is disconnected in exactly one point indicated by D1, D2 and D3, D4, respectively.

Advantageously, a preferred embodiment of the invention features the following steps:
  determining said specific branching point I, P18 proximate to said driver pin P0 for all loops 40, 50 in the electronic circuit;
  determining said branching paths BP40a, BP40b, BP50a, BP50b for every branching point I;
  disconnecting each of said branching paths BP40a, BP40b, BP50a, BP50b; directly adjacent said branching point I, P18 each at a time;
  performing signal delay calculations for said disconnected branching paths BP40a, BP40b, BP50a, BP50b;
  storing a maximum value of said delay values for each receiving pin P1-P19.

Preferably delay calculations are carried out for all nets with a routing graph containing loops 40, 50.

A further embodiment is characterized in that said first branching point I proximate to said receiving pin P1-P19 is the same for all receiving pins P1-P19 outside a loop further downstream with respect to the driver pin P0.

Preferably the calculated delay is used within static timing analysis to prove the parametrical correctness of the electronic circuit.

Reasonably it is checked whether the signal propagates between driver pin P0 and receiving pin P1-P19 within an allowed time interval.

In a further embodiment calculating minimum and maximum delay values is preferably performed in said loops 40, 50.

Advantageously, another preferred embodiment considers nets with loops sharing wiring edges, too, as is shown in FIG. 5a. Here an alternative net topology is depicted consisting of nested loops 60, 70, 80 which are sharing joint edges. Loop 60 is formed by the signal paths 62, 64, 66, 68, 69, loop 70 by the signal paths 66, 72, 74, 76 and loop 80 by the signal paths 62, 64, 68, 69, 72, 74, 76. Thus, loops 60 and 70 share the signal path 66 as a common edge.

Considering driver pin P30 and receiving pin P42, for instance, possible branching paths in loop 60 are consisting of signal paths 62, 69, and 64, 66, 68, respectively. The driver pin 30 is the unique branching point I. In loop 70 possible branching paths comprise signal paths 66, 72 and 74, 76 respectively. In loop 80 possible branching paths comprise signal paths 62, 69, 72 and 64, 68, 74, 76, respectively.

Possible opens for delay calculations are depicted in the FIG. 5a as opens D11-D16. For calculation with a driver P30, advantageously, loop 60 can be disconnected at D11 or at D12, loop 70 can be disconnected at D13, D14 or alternatively, indicated by broken lines, at D15, D16, concerning which branching paths are considered, whereas loop 80 can be disconnected at D11, D12.

FIG. 5b shows a table displaying the Elmore delay values for representative values of the electronic design parameters, calculated for no open and for each of the single opens D11-D16 in the three loops 60, 70, 80 and for each of the possible receiving pins P30-P42. The dimensions of the net tree used for calculation of the delay values were the length for signal paths 66, 76 is 100 μm, for signal paths 72, 74 is 120 μm, and for signal paths 68, 69 is 50 μm.

Again the method according to the preferred embodiment was validated also for nested loops by assuming an open in every wiring segment and calculating the delay values. It was observed that the overall maximum was identical with the maximum delay value obtained in the table of FIG. 5*b* thus confirming the validity of the method for nested loops too.

Reasonably two branching points, i.e. P30 and OP1 in loop 60, OP1 and P42 in loop 70 and P30, P42 in loop 80 are specified in the routing graph. OP2 is an alternative branching point if the loop 70 is opened at the alternative opens D15, D16.

Preferably in another preferred embodiment of the invention the proposed delay calculation method for static timing analysis is used within a routing method for routing wires of nets of an electronic circuit. Thus a very time efficient functional analysis of the electronic circuit may be realized for testing of a failure tolerant layout of the circuit.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of networks adapters.

FIG. 6 depicts schematically a data processing system, consisting of a computer 200 comprising a central processing unit 202, a computer usable medium, comprising computer readable program 204 connected by a bus system 206 to the central processing unit 202, an IO system 212 connected to input and output devices 208, 210. The computer is further connected to a network communication unit 214. The said data processing system comprises software code portions for performing a delay calculation method according to at least one of the preferred embodiments of the invention when said program is run on said computer 200.

The invention claimed is:

1. A delay calculation method for wiring nets of an electronic circuit, wherein a net within an electronic circuit comprises a driver pin and a receiving pin being coupled by at least one loop, said loop comprising a first branching path and a second branching path electrically parallel to said first branching path, wherein at least a first and a second branching point connect said branching paths, characterized by the steps of:
   disconnecting each branching path once at a time at a specific point in said at least one loop which connects a driver to at least one specific receiving pin;
   calculating a delay value of a signal connection between said driver pin and each of said receiving pin for each of said disconnected branching paths of each loop;
   storing at least maximum and/or minimum values of said calculated delay values; and
   applying at least one of said delay values for static timing analysis of the electronic circuit using a computer.

2. The method according to claim 1, characterized by a net within an electronic circuit comprising a driver pin and a receiving pin being coupled by more than one loop, and further comprising the steps of:
   disconnecting each branching path once at a time for any combination of branching paths at a specific point in said more than one loop which connect a driver to at least one specific receiving pin;
   calculating a delay value of a signal connection between said driver pin and each of said receiving pins for each of said disconnected branching paths of each loop;
   storing at least maximum and/or minimum values of said calculated delay values; and
   applying at least one of said delay values for static timing analysis of the electronic circuit.

3. The method according to claim 2, characterized in disconnecting said branching paths close to a joint specific branching point.

4. The method according to claim 3, characterized in disconnecting said branching paths adjacent to said branching point proximate to said driver pin.

5. The method according to claim 4, characterized in disconnecting each of said branching paths in exactly one point for a specific receiving pin.

6. The method according to claim 5, characterized in calculating two delay values for each loop with disconnected branching paths.

7. The method according to claim 6, characterized in storing a maximum and/or minimum value of said delay values for each loop.

8. The method according to claim 7, characterized in:
   determining said specific branching point proximate to said driver pin for all loops in the electronic circuit;
   determining said branching paths for every branching point;
   disconnecting each of said branching paths directly adjacent said branching point each at a time;
   performing signal delay calculations for said disconnected branching paths storing a maximum and/or minimum value of said delay values for each receiving pin.

9. The method according to claim 8, characterized in performing delay calculations for all nets with a routing graph containing loops.

10. The method according to claim 9, characterized in specifying two branching points in every loop of said routing graph.

11. The method according to claim 10, characterized in that said first branching point of a loop is the same for all receiving pins outside said loop further downstream with respect to the driver pin.

12. The method according to claim 11, characterized in using static timing analysis for applying said stored maximum and/or minimum signal delay values for analyzing the electronic circuit.

13. The method according to claim 12, characterized by checking whether the signal propagates between driver pin and receiving pin within an allowed time interval.

14. The method according to claim 13, characterized by calculating minimum and maximum delay values in said loops.

15. A computer program product comprising code embodied in a non-transitory computer usable medium, said non-transitory computer usable medium comprising computer readable program means for causing a computer to perform a method according to claim 1 when said computer program product is run on a computer.

16. A computer program product comprising a non-transitory computer usable medium readable by a processing circuit and storing instructions for execution by the processing circuit for performing a method comprising:
- disconnecting branching paths once at a time at a specific point in at least one loop which connects a driver to at least one specific receiving pin;
- calculating a delay value of a signal connection between a driver pin and a receiving pin connected by said at least one loop for each of said disconnected branching paths of each loop;
- storing at least maximum and/or minimum values of said calculated delay values; and
- applying at least one of said delay values for static timing analysis of the electronic circuit.

* * * * *